United States Patent [19]
Hashimoto et al.

[11] Patent Number: 5,786,113
[45] Date of Patent: Jul. 28, 1998

[54] PHOTO-MASK USED IN ALIGNER FOR EXACTLY TRANSFERRING MAIN PATTERN ASSISTED BY SEMI-TRANSPARENT AUXILIARY PATTERN AND PROCESS OF FABRICATION THEREOF

[75] Inventors: Shuichi Hashimoto; Kunihiko Kasama, both of Tokyo, Japan

[73] Assignee: NEC Corporation, Japan

[21] Appl. No.: 670,768

[22] Filed: Jun. 24, 1996

[30] Foreign Application Priority Data

Jun. 29, 1995 [JP] Japan .................... 7-163895

[51] Int. Cl.⁶ .................................................. G03F 9/00
[52] U.S. Cl. .................................................. 430/5
[58] Field of Search .................................................. 430/5

[56] References Cited

U.S. PATENT DOCUMENTS 5,547,789  8/1996  Nakatani et al. .................. 430/5
5,563,009  10/1996  Bae .................................. 430/5

FOREIGN PATENT DOCUMENTS 5-165194  6/1993  Japan .

*Primary Examiner*—Christopher G. Young
*Attorney, Agent, or Firm*—Hayes, Soloway, Hennessey, Grossman & Hage, P.C.

[57] ABSTRACT

A photo-mask has a main pattern implemented by a photo-shield strip and an auxiliary pattern implemented by semi-transparent strips, and the photo-shield strip is equal in width to the semi-transparent strips so as to allow the photo-shield strip to be close to the resolution limit without destroy of the effects of the auxiliary pattern.

15 Claims, 13 Drawing Sheets

PHOTO-MASK USED IN ALIGNER FOR EXACTLY TRANSFERRING MAIN PATTERN ASSISTED BY SEMI-TRANSPARENT AUXILIARY PATTERN AND PROCESS OF FABRICATION THEREOF

FIELD OF THE INVENTION

This invention relates to a photo-mask and, more particularly, to a photo-mask used in a projection aligner during fabrication of a semiconductor device and a process of fabrication thereof.

DESCRIPTION OF THE RELATED ART

A dynamic random access memory device is a typical example of an ultra large scale integration, and the minimum line width is getting smaller and smaller together with the dimensions of the circuit components. A narrow line width requires high-resolution lithography. A reduction projection aligner is available for a pattern transfer from a reticle to a photo-resist layer, and ultraviolet light carries a pattern image on the reticle to the photo-resist layer. When the projection optical system of the aligner focuses the pattern image on the surface of the photo-resist layer, the pattern image is transferred to the photo-resist at high resolution. However, the photo-resist is usually spread over an uneven surface of a laminated structure, and, accordingly, the photo-resist layer has an uneven surface. For this reason, the focal plane is partially deviated from the surface of the photo-resist layer, and a depth of focus is required for the pattern transfer.

The relationship between the resolution R and the depth of focus DOF is expressed as follows.

$$R = K1 \times lambda/NA \qquad \text{equation 1}$$

$$DOF = K2 \times lambda/NA^2 \qquad \text{equation 2}$$

where lambda is an exposure wave-length, NA is a numerical aperture and K1 and K2 are coefficients determined depending upon the fabrication process.

It is understood from equation 1 that a shorter exposure wave-length and a larger numerical aperture result in a higher resolution. However, equation 2 teaches us that the shorter exposure wave-length and the larger numerical aperture decrease the depth of focus. Thus, there is a trade-off between the resolution and the depth of focus.

As described hereinbefore, the recent development of the integration density requires higher resolution lithography, and the depth of focus is getting more severe.

First, various factors of the depth of focus are analyzed hereinbelow. As will be understood from equation 2, the numerical aperture NA is squared, and, accordingly, has a strong influence on the depth of focus. On the other hand, the coefficient K2 is simply multiplied by the exposure wave-length, and the depth of focus is therefore less affected by the exposure wave-length. For this reason, the resolution has been improved by changing the exposure light, and the reduction projection aligner has changed the exposure light from g-ray of a mercury lamp through i-ray to excimer laser light of KrF. The exposure wave-length has been decreased from 436 nanometers through 365 nanometers to 248 nanometers, and the resolution is surely improved. However, when the exposure light is changed, the manufacturer needs new resist technologies such as a new photo-resist, and the change of exposure light is not easy.

Other factors are the coefficients K1 and K2. If the coefficient k2 is enlarged and the coefficient K1 is made small, the resolution R is enhanced without deterioration of the depth of focus DOF. These coefficients K1 and K2 are dependent on the resist technologies and an accuracy of pattern transfer through the optical system of the aligner. The composition of photo-resist, the coating technology and the developing technology are examples of the related resist technologies, and the composition of photo-resist has a strong influence on the resolution R and the depth of focus DOF.

When the pattern image was transferred through the i-ray, novolak resin was used for the photo-resist. The novolak resin was mixed with photo-sensitive material. Although the novolak resin is hydrophilic and dissolved in alkaline developing solution, the photo-sensitive material is lipophilic and serves as a dissolution inhibitor. However, when the photo-sensitive material is exposed to light, the photo-sensitive material is changed to be hydrophilic, and the photo-resist exposed to the light becomes soluble in the developing solution. The novolak photo-resist is a positive photo-resist.

The absorption of the novolak photo-resist is too large to use in the pattern transfer through the excimer laser light of KrF. A new photo-resist has therefore been developed. This photo-resist for excimer laser light is known as a "chemically amplified resist". The chemically amplified resist contains an acid generator and a resin in which the hydroxyl group of polyvinylphenol is replaced with a hydrophobic group, and the hydrophobic group serves as a protective group. When the chemically amplified resist is exposed to light, the acid generator supplies a hydrogen ion to the protective group, and the hydrogen ion serves as a catalyst. The hydrogen ion eliminates the protective group from the polyvinylphenol, and the photo-resist becomes soluble. The chemically amplified resist is a positive resist.

Thus, the change of exposure light has required new resist technologies, and the new resist technologies are not easily developed.

The last factor is the accuracy of pattern transfer through the optical system of the aligner. The accurate pattern transfer technologies presently available are categorized into three groups. The first category relates to the configuration of a light source, and the modified illumination is a typical example of the first category. The second category relates to a pupil surface of the projection lens unit incorporated in the optical system, and the pupil filter is an example of the second category. The third category relates to a photo-mask, and a phase-shift technology and an auxiliary pattern technology are incorporated in the third category. Dominative effects are different between the three categories depending upon the patterns on a photo-mask to be transferred.

The modified illumination and the phase shift technology take advantages of interference between two illuminous fluxes, and improve the resolution and the depth of focus for a periodically repeated pattern.

The modified illumination technology effectively improves the resolution and the depth of focus for a periodically repeated pattern. However, the effects of the modified illumination for an isolated pattern are poor, because the light is uniformly diffracted at the isolated pattern or an end portion of the periodically repeated pattern and, accordingly, the two illuminous fluxes are hardly interfered. Thus, the modified illumination technology is limited to a periodically repeated pattern image.

The pupil filter technology changes the distribution of spatial frequency on the pupil surface of a projection lens, and makes the focal plane multiple. The pupil filter technology achieves an improvement to both of the periodically repeated pattern and an isolated pattern. However, the pupil filter technology requires a modification of the pupil surface of the projection lens, and it is quite difficult to put the pupil filter technology into practical usage.

The auxiliary pattern technology adds an auxiliary pattern to a main pattern. The component of the auxiliary pattern to be added is smaller in dimensions than the main pattern, and improves both the resolution and the depth of focus.

A typical example of the auxiliary pattern technology is disclosed in Japanese Patent Publication of Unexamined Application No. 5-165194, and FIG. 1 illustrates the photo-mask disclosed therein. The photo-mask is used in a stepping reduction projection aligner, and the pattern image on the photo-mask is demagnified at ⅕ on a photo-resist layer.

The prior art photo-mask comprises a transparent glass substrate 1 and a photo-shield film 2 of chromium laminated on the transparent glass substrate 1. The photo-shield film 2 is hatched so as to easily discriminate exposed areas of the transparent glass substrate 1 therefrom. A wide rectangular opening 2a and narrow rectangular opening 2b and 2c are formed in the photo-shield film 2, and the transparent glass substrate 1 is exposed to the wide rectangular opening 2a and the narrow rectangular openings 2b and 2c. The wide rectangular opening 2a forms a pattern image to be transferred to the photo-resist layer for forming a part of an integrated circuit, and serves as a main pattern. On the other hand, the narrow rectangular openings 2b and 2c are provided on both sides of the wide rectangular opening 2a, and serve as an auxiliary pattern. In this instance, the wide rectangular opening 2a is 1.5 microns in width, and the narrow rectangular openings 2b and 2c are 0.75 micron in with. The center line of the wide rectangular opening 2a is spaced from the center line of each narrow rectangular opening 2b/2c by 4.5 microns.

When the prior art photo-mask is exposed to light, the light passes through the wide rectangular opening 2a and the narrow rectangular openings 2b/2c, and the transmitted illuminous fluxes fall onto the photo-resist layer. If the distance between the center lines, the wavelength of the exposure light, the demagnification ratio and the numerical aperture are appropriately determined, the transmitted illuminous fluxes through the narrow rectangular openings 2b/2c are interfered with by the transmitted illuminous flux through the wide rectangular openings, which increases the intensity of light in the area of the photo-resist layer where the main pattern is to be transferred. This results in the improvement of the resolution and the depth of focus.

Thus, the main pattern is accompanied with the auxiliary pattern, and an isolated pattern is never formed on the photo-mask. For this reason, the auxiliary pattern technology removes the limitation set on the modified illumination.

However, a problem is encountered in the prior art auxiliary pattern technology in that a miniature main pattern makes the components of the auxiliary pattern exceed the resolution limit. As described hereinbefore, the component of the auxiliary pattern is smaller in dimension than the main pattern at all times, and a main pattern close to the resolution limit causes the components of the auxiliary pattern to exceed the resolution limit.

Another problem is the proximity effect between the periodically repeated pattern and the isolated pattern. The proximity effect is dependent on the distance between the periodically repeated pattern and the isolated pattern. An illuminous flux passing through a periodically repeated pattern forms a distribution of light intensity different from a distribution of light intensity formed by an illuminous flux passing through an isolated pattern. If the exposure light is regulated to an appropriate value for a resist pattern exactly matched with a periodically repeated pattern on a photo-mask, a resist pattern transferred from an isolated pattern is deviated from the dimensions to be expected. This is because of the fact that the components of the auxiliary pattern are relatively small in number.

Yet another problem is also encountered in the pattern transfer from a periodically repeated pattern and an isolated pattern to the chemically amplified resist for the excimer laser of KrF. As described hereinbefore, the excimer laser causes the chemically amplified resist to generate a hydrogen ion, and the amount of hydrogen ion and, accordingly, the solubility are proportional to the intensity of the excimer laser on the chemically amplified resist layer. Even if the auxiliary pattern technology is applied to a photo-mask, the periodically repeated pattern and the isolated pattern differently transmit the excimer laser onto the chemically amplified resist, and a difference in solubility takes place between an area radiated through the periodically repeated pattern and another area radiated through the isolated pattern. As a result, the periodically repeated pattern and the isolated pattern are differently transferred from the photo-mask to the chemically amplified resist layer. Another reason for the incorrect pattern transfer is derived from a diffusion of hydrogen ion. If a wide transparent space extends around a narrow non-transparent pattern, the illuminous light generates a large amount of hydrogen ion in a wide area corresponding to the wide transparent space, and the large amount of hydrogen ion is diffused into a narrow area corresponding to the narrow non-transparent pattern. The hydrogen ion makes the narrow area soluble, and damages the resist pattern.

SUMMARY OF THE INVENTION

It is therefore an important object of the present invention to provide a photo-mask which is less affected by the proximity effect and a difference in pattern density on a photo-mask and achieves a high resolution and a deep depth of focus even if an isolated main pattern is close to the resolution limit.

It is also an important object of the present invention to fabricate the photo-mask as herein described.

To accomplish the object, the present invention proposes to impart a small transmittance to an auxiliary pattern.

In accordance with one aspect of the present invention, there is provided a photo-mask used in a pattern transfer to a photo-sensitive layer, comprising a substrate having a first transmittance; a photo-shield pattern having a second transmittance, and assigned a first area of the substrate; and a semi-transparent pattern having a third transmittance greater than the second transmittance and less than the first transmittance, and assigned a second area of the substrate in the vicinity of the first area, the photo-shield pattern and one of the substrate and the semi-transparent pattern defines a main pattern to be transferred to the photo-sensitive layer through an optical radiation, and the semi-transparent pattern and one of the substrate and the photo-shield pattern defines an auxiliary pattern so as to cause the optical radiation to exactly transfer the main pattern to the photo-sensitive layer.

In accordance with another aspect of the present invention, there is provided a process of fabricating a photo-mask comprising the steps of: a) preparing a substrate having a first transmittance; b) laminating a semi-transparent layer having a second transmittance less than the first transmittance, an etching stopper layer and a photo-shield layer having a third transmittance less than the second transmittance on the substrate for forming a primary multiple-level structure on the substrate, the etching stopper layer being effective against an etchant for the photo-shield layer; c) providing a first etching mask on the primary multiple-level structure; d) selectively etching the primary multiple-level structure so as to form a secondary multiple-level structure from the primary multiple-level structure, a pat of the substrate being exposed to a hollow space formed in the secondary multiple-level structure; e) removing the first etching mask from the secondary multiple-level structure; f) providing a second etching mask on the secondary multiple-level structure; g) selectively etching the photo-shield layer of the secondary multiple-level structure so as to form at least one recess in the secondary multiple-level structure, a part of the etching stopper layer being exposed to the at least one recess; and h) removing the second etching mask.

BRIEF DESCRIPTION OF THE DRAWINGS

The features and advantages the photo-mask and the process of fabrication thereof according to the present invention will be more clearly understood from the following description taken in conjunction with the accompanying drawings in which.

DESCRIPTION OF THE PREFERRED EMBODIMENTS

First Embodiment

Figure 1:
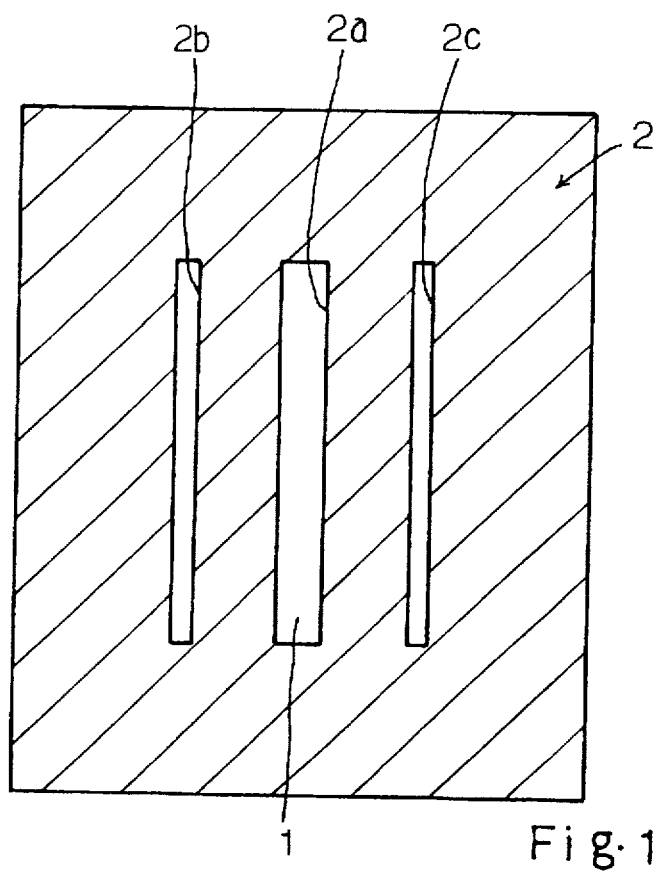
FIG. 1 is a plan view showing the prior art photo-mask having the main pattern accompanied with the auxiliary pattern.
Figure 2:
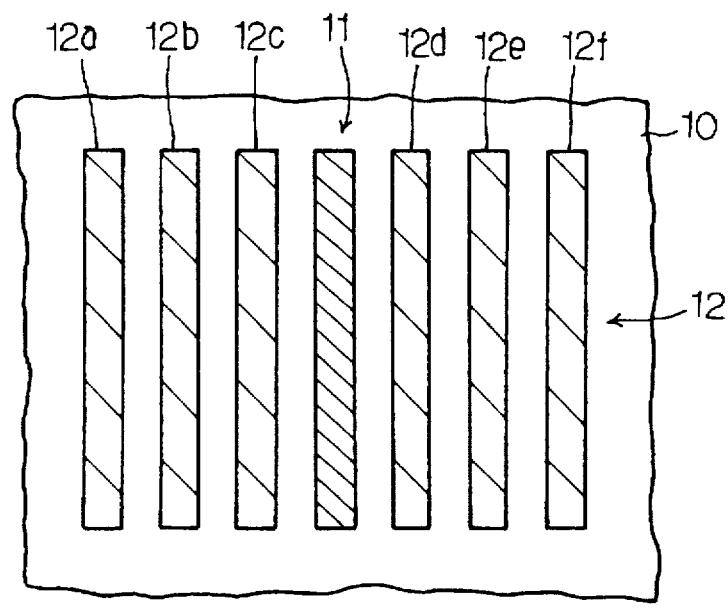
FIG. 2 is a plan view showing the layout on a part of a photo-mask according to the present invention.
Figure 3:
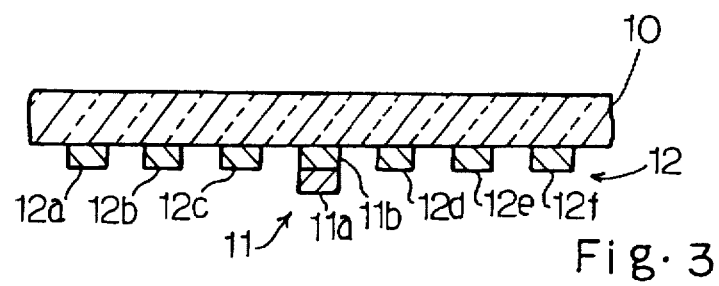
FIG. 3 is a cross sectional view showing the structure of the part of the photo-mask shown in FIG. 2.

Referring to FIGS. 2 and 3 of the drawings, a photo-mask embodying the present invention largely comprises a transparent glass substrate 10, an isolated main pattern 11 formed on the transparent glass substrate 10 and an auxiliary pattern 12 also formed on the transparent glass substrate 10. The photo-mask is available for a pattern transfer through a stepping reduction projection aligner, and the isolated main pattern is five times larger than a pattern image on a photo-resist layer. Description is herein made on the assumption that the photo-resist is a positive resist. However, a photo-resist mask according to the present invention is available for a pattern transfer to a negative photo-resist.

The isolated main pattern 11 is implemented by a single non-transparent rectangular lamination on the transparent glass substrate 10 hereinbelow labeled with the same reference 11, and the auxiliary pattern 12 is implemented by six semi-transparent rectangular strips 12a, 12b, 12c, 12d, 12, and 12f on the transparent glass substrate 10. In other words, the non-transparent rectangular lamination define the isolated main pattern 11 in the transparent glass substrate 10, and the semi-transparent rectangular strips 12a to 12f define the semi-transparent auxiliary pattern 12 in the transparent glass substrate 10.

A photo-shield rectangular strip 11a is laminated on a semi-transparent rectangular strip 11b, and the photo-shield rectangular strip 11a and the semi-transparent rectangular strip 11b form in combination the single non-transparent rectangular lamination. Although the semi-transparent rectangular strips 12a to 12f and the photo-shield rectangular strip 11a are hatched in FIG. 2, the hatching lines are provided for the sake of clear discrimination of these strips from the transparent glass substrate 10.

The semi-transparent rectangular strips 12a to 12c are located on the left side of the non-transparent rectangular lamination 11 at intervals, and the other semi-transparent rectangular strips 12d to 12f are located on the right side of the non-transparent rectangular lamination 11 at intervals. The pitch of the semi-transparent rectangular strips 12a to 12f and the non-transparent rectangular lamination 11 are constant.

The single non-transparent rectangular lamination 11 and the semi-transparent rectangular strips 12a to 12f are 1.25 microns in width, and the semi-transparent rectangular strips 12a to 12c and 12d to 12f are spaced from each other by 1.25 microns.

The semi-transparent rectangular strip 11b is formed from the same semi-transparent material as the semi-transparent rectangular strips 12a to 12f, and the transmittance of the semi-transparent material affects the number of the semi-transparent rectangular strips 12a to 12f forming in combination the auxiliary pattern 12 as will be described hereinlater. In other words, the number of the semi-transparent rectangular strips 12a–12c/12d–12f provided on the left or right side is never limited to three, and is variable depending upon the transmittance of the semi-transparent material.

The photo-shield rectangular strip 11a is formed of chromium, and the transmittance is zero. The semi-transparent rectangular strip 11b is registered with the photo-shield rectangular strip 11a.

Thus, although the non-transparent rectangular lamination 11 is different in transmittance from the semi-transparent rectangular strips 12a to 12f, the non-transparent rectangular lamination 11 is equal in length and width to the semi-transparent rectangular strips 12a to 12f.

Using the photo-mask shown in FIGS. 2 and 3, the present inventors simulated the pattern transfer through the line-and-space pattern, and obtained distributions of optical intensity at different transmittances of the auxiliary pattern 12. The simulation was carried out on the assumption that the photo-mask was installed in a reduction projection aligner with the demagnification ratio of 1/5, and the numerical aperture NA, the coherency (sigma) of the irradiate light and the wave-length (lambda) of the irradiated light were 0.5, 0.7 and 248 nanometers. The coherency (sigma) is given by dividing the numerical aperture of an optical lens associated with the light source by the numeral aperture of the projection lens.

Figure 4A:
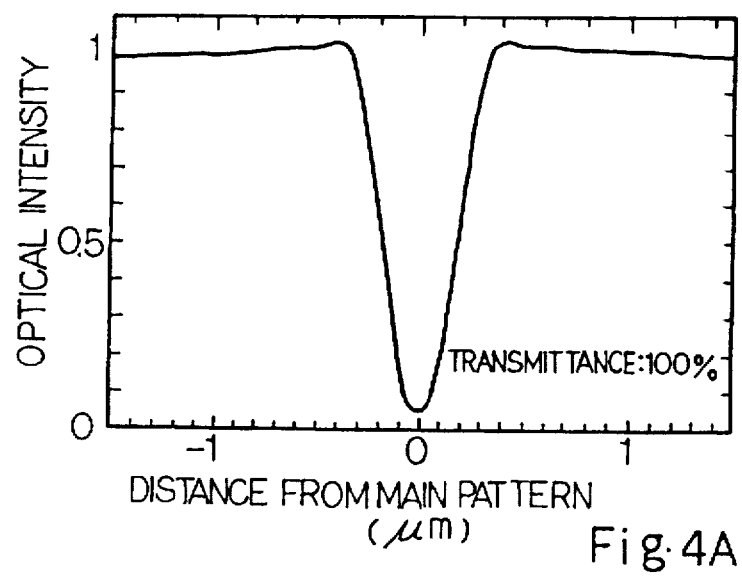
FIG. 4A is a graph showing a distribution of optical intensity under the transmittance of an auxiliary pattern at 100 percent.
Figure 4B:
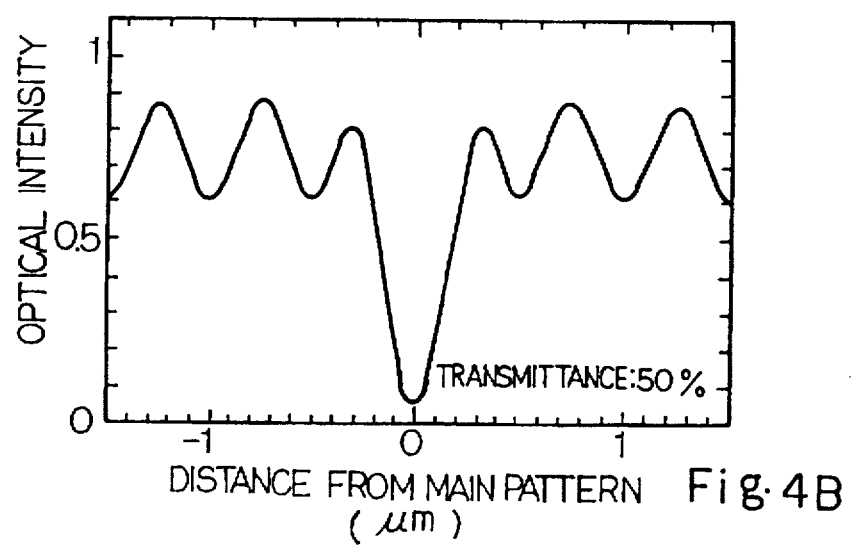
FIG. 4B is a graph showing a distribution of optical intensity under the transmittance of an auxiliary pattern at 50 percent.
Figure 4C:
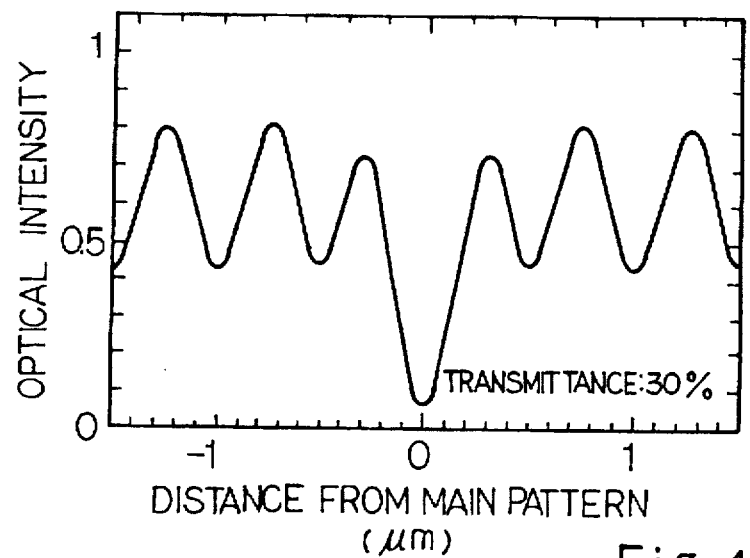
FIG. 4C is a graph showing a distribution of optical intensity under the transmittance of an auxiliary pattern at 30 percent.
Figure 4D:
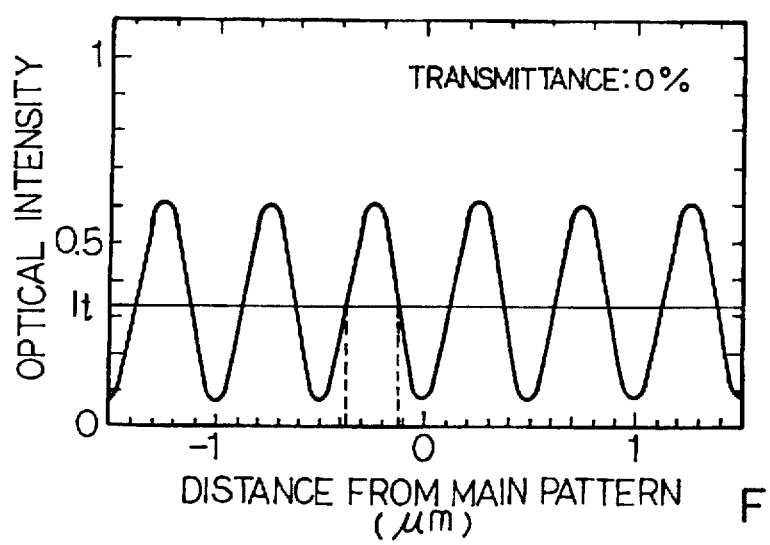
FIG. 4D is a graph showing a distribution of optical intensity under the transmittance of an auxiliary pattern at zero percent.

FIG. 4A illustrates the distribution of optical intensity under the transmittance of the auxiliary pattern 12 at 100 percent, FIG. 4B illustrates the distribution of optical intensity under the transmittance of the auxiliary pattern 12 at 50 percent, FIG. 4C illustrates the distribution of optical intensity under the transmittance of the auxiliary pattern 12 at 30 percent, and FIG. 4D illustrates the distribution of optical intensity under the transmittance of the auxiliary pattern 12 at zero percent.

The optical intensity was normalized, and is indicative of the optical intensity in the space region of the photo-mask. The distribution of optical intensity shown in FIG. 4A corresponds to a distribution of optical intensity obtained through an isolated pattern, and the distribution of optical intensity shown in FIG. 4D corresponds to a distribution of optical intensity obtained through a periodically repeated pattern.

The reduction projection aligner was expected to transfer the line width of 1.25 microns to a photo-resist layer at the demagnification ratio of 1/5. When the line-and-space pattern was exactly transferred to the photo-resist mask, the line width on the photo-resist was decreased to 0.25 micron. The optimum intensity It for the line width of 0.25 micron was 0.337 (see FIG. 4D).

If the optical intensity is weaker than the optimum intensity It, a residue of photo-resist is added to the resist pattern. On the other hand, if the optical intensity is stronger than the optimum intensity It, the resist pattern is damaged.

It is necessary not to transfer the auxiliary pattern 12 to the photo-resist, and the auxiliary pattern 12 is expected to decrease the optical intensity on the photo-resist to lower values than the optimum intensity It. If the transmittance is not less than 30 percent, the auxiliary pattern 12 can decrease the optical intensity on the photo-resist layer lower than the optimum intensity It.

If the transmittance of the auxiliary pattern 12 is regulated to 30 percent, the optical intensity on the photo-resist layer is decreased to 60 percent of the optical intensity passing through an auxiliary pattern with the transmittance of 100 percent. For this reason, when the photo-resist mask is of the chemically amplified type, the hydrogen ion is also decreased to 60 percent in the area of the photo-resist corresponding to the auxiliary pattern 12.

The auxiliary pattern 12 gives periodicity to the main pattern 11, and decreases optical intensity on peripheral areas of a photo-resist layer on both sides of an area corresponding to the main pattern 11.

Figure 5:
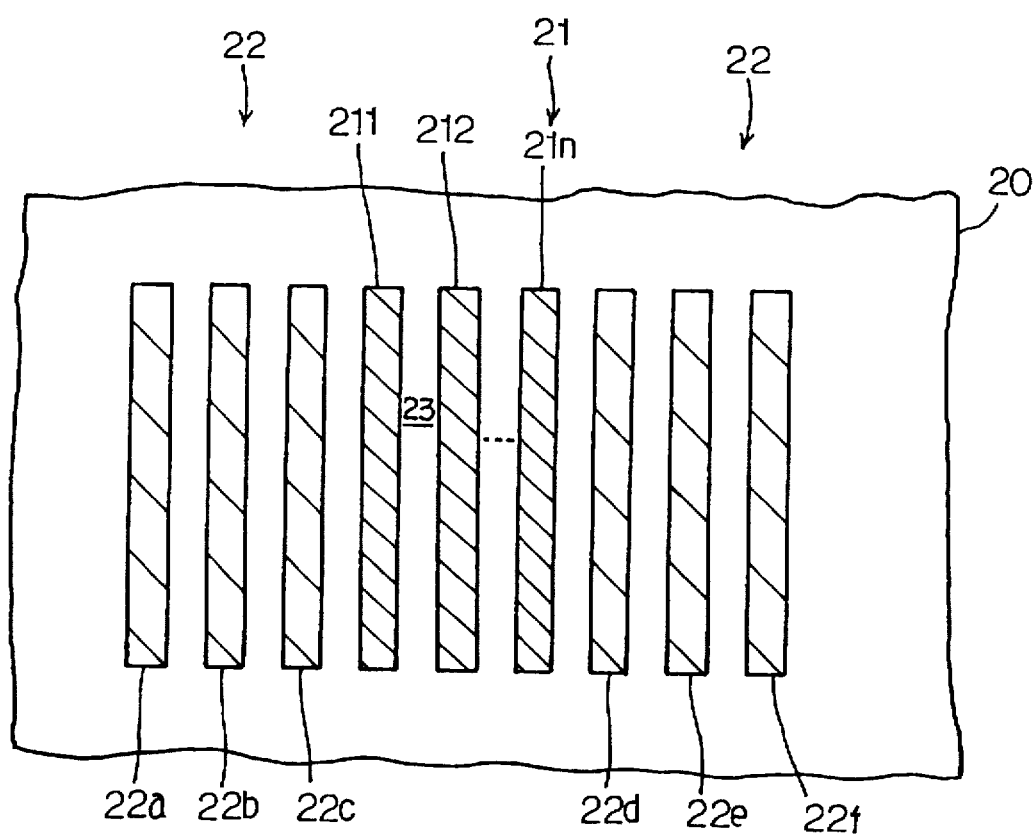
FIG. 5 is a plan view showing another photo-mask according to the present invention.

Turning to FIG. 5 of the drawings, another photo-mask embodying the present invention comprises a transparent substrate 20, a non-transparent main pattern 21 formed on the transparent substrate 20 and a semi-transparent auxiliary pattern 22 also formed on the transparent substrate 20.

The non-transparent main pattern 21 is implemented by non-transparent rectangular strips 211, 212, . . . and 21n periodically repeated at intervals on the transparent substrate 20. In other words, the non-transparent rectangular strips 211 to 21n define the non-transparent main pattern 21 in the transparent substrate 20. A space 23 takes place between the adjacent two non-transparent rectangular strips such as 211 and 212, and the space 23 is equal in width to the non-transparent rectangular strips 211 to 21n. Thus, the non-transparent rectangular strips 211 to 21n form a line-and-space pattern together with the transparent substrate 20. Though not shown in the drawings, the non-transparent rectangular strips 211 to 21n are similar in structure to the non-transparent rectangular lamination 11, and semi-transparent rectangular layers are respectively coated with photo-shield films.

Semi-transparent rectangular strips 22a–22c and 22d–22f and the transparent substrate 20 form in combination the semi-transparent auxiliary pattern 22. The semi-transparent rectangular strips 22a to 22f are equal in length and width to the non-transparent rectangular strips 211 to 21n, and the semi-transparent rectangular strips 22a to 22f and the non-transparent rectangular strips 211 to 21n are 1.25 microns in width. The semi-transparent rectangular strips 22a to 22c and the other semi-transparent rectangular strips 22d to 22f are located on both sides of the non-transparent main pattern 21. Although the non-transparent rectangular strips 211 to 21n and the semi-transparent rectangular strips 22a to 22f are hatched, the hatching lines are provided for the sake of clear discrimination of these strips 211 to 21n and 22a to 22f from the transparent substrate 20.

The transmittance of the semi-transparent rectangular strips 22a to 22f is determined through a similar method to the semi-transparent rectangular strips 12a to 12f, and ranges from 30 percent to 50 percent.

The semi-transparent auxiliary pattern 22 on both sides of the non-transparent main pattern 21 imparts the periodicity to the non-transparent rectangular strips 211 and 21n at both ends of the non-transparent main pattern 21, and decreases the optical intensity on both sides of the non-transparent main pattern 21.

Figure 6:
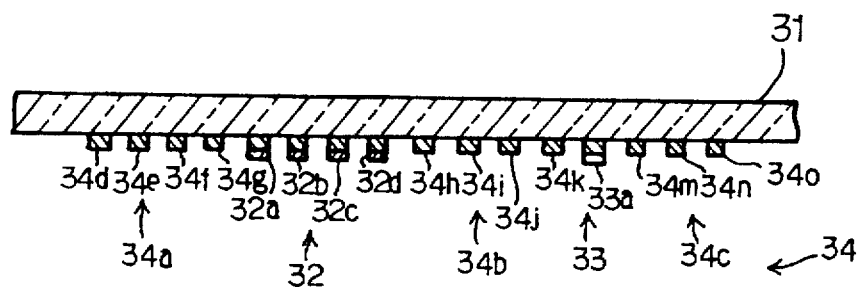
FIG. 6 is a cross sectional view showing the structure of yet another photo-mask according to the present invention.

FIG. 6 illustrates yet another photo-mask embodying the present invention. The photo-mask comprises a transparent glass substrate 31, a first non-transparent main pattern 32, a second non-transparent main pattern 33 and a semi-transparent auxiliary pattern 34, and the first non-transparent main pattern 32, the second non-transparent main pattern 33 and the semi-transparent auxiliary pattern 34 are formed on the transparent glass substrate 31.

The first non-transparent main pattern 32 is a line-and-space pattern similar to the non-transparent main pattern 21, and non-transparent rectangular strips 32a, 32b, 32c and 32d are periodically repeated on the transparent glass substrate 31. Therefore, the non-transparent rectangular strips 32a to 32d define the first non-transparent main pattern 32 in the transparent glass substrate 31.

On the other hand, the second non-transparent main pattern 33 is an isolated pattern similar to the main pattern 11, and is implemented by a single non-transparent rectangular strip 33a on the transparent glass substrate 31. Therefore, the single non-transparent rectangular strip 33a define the second non-transparent main pattern 33 in the transparent glass substrate 31. Semi-transparent rectangular layers coated with photo-shield films which serve as the non-transparent rectangular strips 32a to 32d and 33a, respectively.

The semi-transparent auxiliary pattern 34 has three semi-transparent sub-patterns 34a, 34b and 34c. The semi-transparent sub-pattern 34a is located on the left side of the first non-transparent main pattern 32, and the third semi-transparent sub-pattern 34c is provided on the right side of the second non-transparent main pattern 33. The second semi-transparent sub-pattern 34b is formed between the first non-transparent pattern 32 and the second non-transparent pattern 33. The first semi-transparent sub-pattern 34a, the second semi-transparent sub-pattern 34b and the third semi-transparent sub-pattern 34c are implemented by semi-transparent rectangular strips 34d–34g, semi-transparent rectangular strips 34h–34j and semi-transparent rectangular strips 34m–34o, respectively.

The semi-transparent rectangular strips 34d to 34o are equal in length and width to the non-transparent rectangular strips 32a–32d and the non-transparent rectangular strip 33a, and are 1.25 microns in width. The semi-transparent rectangular strips 34d to 34o are repeated at intervals of 1.25 microns, and the adjacent two non-transparent rectangular strips 32a to 32d are also spaced from each other by 1.25 micron. Thus, the semi-transparent/non-transparent rectangular strips 32a/32d/33/34d–34o are altered with the spaces over the transparent glass substrate 31.

The semi-transparent auxiliary pattern 34 gives the periodicity to the non-transparent rectangular strips 32a/32d at both ends of the first non-transparent main pattern 32 and the isolated non-transparent rectangular strip 33a, and decreases optical intensity in areas of a photo-resist layer adjacent to areas corresponding to the first and second non-transparent main patterns 32 and 33.

Figure 7:
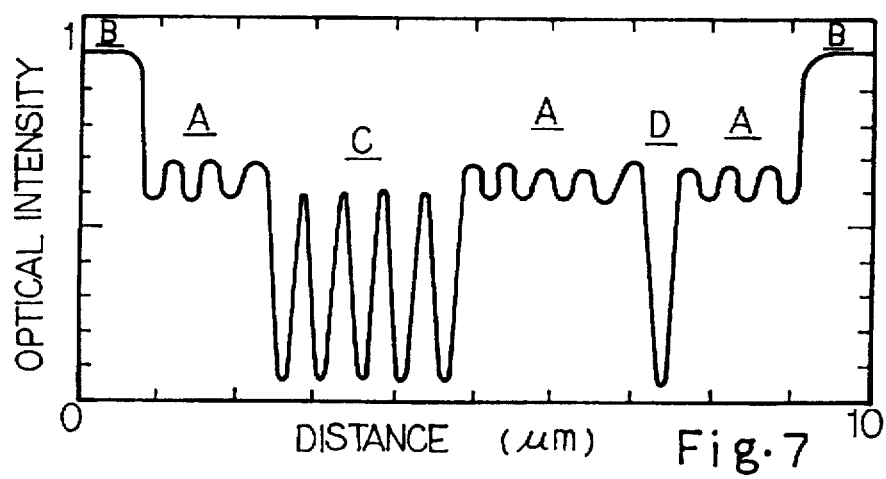
FIG. 7 is a graph showing a distribution of optical intensity on a photo-resist mask radiated through the photo-mask shown in FIG. 6.

When the patterns on the photo-mask shown in FIG. 6 were transferred to a chemically amplified photo-resist layer, a distribution of optical intensity took place on the chemically amplified photo-resist layer as shown in FIG. 7. Regions A and B correspond to the semi-transparent sub-patterns 34a, 34b and 34c and the transparent glass substrate 31 on both sides of the semi-transparent auxiliary pattern 34, respectively, and regions C and D were radiated through the first non-transparent main pattern 32 and the second non-transparent main pattern 33, respectively. The optical intensity in regions A was of the order of 60 percent with respect to the optical intensity in regions B, and, accordingly, the hydrogen ion generated at unit area in regions A was decreased to 60 percent of the hydrogen ion generated at unit area in regions B.

If the regions A were contiguous to the regions C and D, excess hydrogen ion would be diffused into the regions C and D so as to damage the resist patterns. However, the regions B took up the excess hydrogen ion, and prevented the regions C and D from the excess hydrogen ion. The semi-transparent auxiliary patterns 12 and 22 similarly prevent areas on chemically amplified photo-resist layers from excess hydrogen ion, and the main patterns 11 and 21 are exactly transferred to the chemically amplified photo-resist layers.

The optical intensity in the regions A is periodically waved due to the periodically repeated semi-transparent rectangular strips 34d to 34o, and the periodically repeated semi-transparent rectangular strips 34d to 34o generate high-order diffracted light components. The high-order diffracted light components are available for the modified illumination, and increases the depth of focus for the images produced from the non-transparent rectangular strips 32a and 32d at both ends of the first non-transparent main pattern 32.

As will be understood from the foregoing description, the semi-transparent rectangular strips 12a to 12f are equal in dimension to the non-transparent lamination 11, and allow the non-transparent lamination 11 to be close to the resolution limit.

The semi-transparent rectangular strips of each auxiliary pattern supplement the periodicity for the non-transparent main pattern/patterns, and effectively decreases the optical intensity on both sides of the non-transparent rectangular lamination 11. For this reason, the proximity effect is equalized, and the resist pattern/patterns are exactly transferred to a chemically amplified photo-resist layer without a deformation by virtue of the intentional reduction of the optical intensity around the photo-resist pattern/patterns.

Second Embodiment

Figure 8:
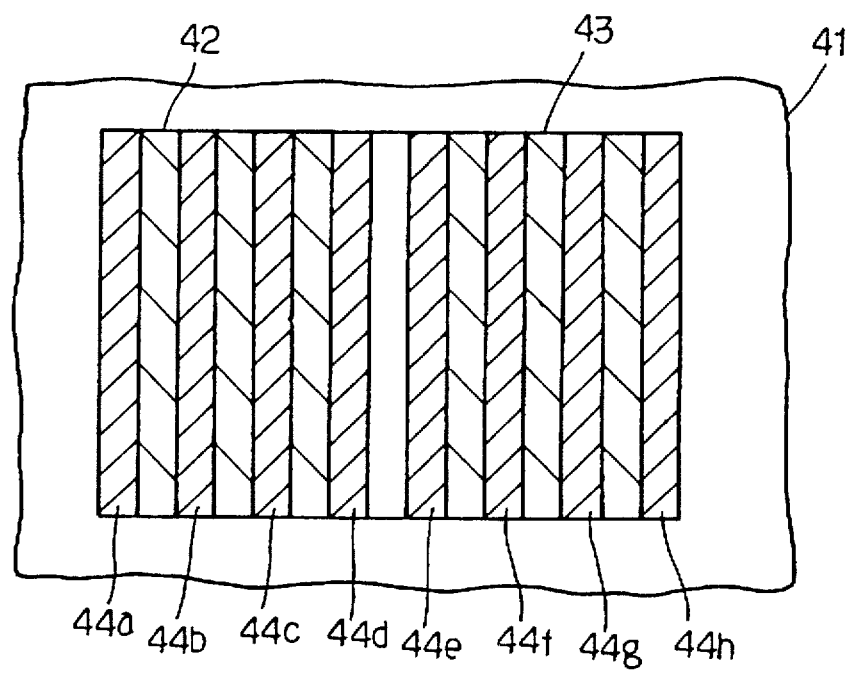
FIG. 8 is a plan view showing still another photo-mask according to the present invention.
Figure 9:
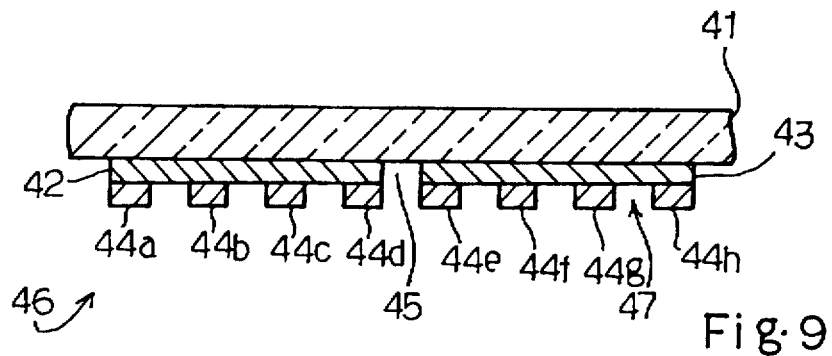
FIG. 9 is a cross sectional view showing the structure of the photo-mask shown in FIG. 8.
Figure 10A:
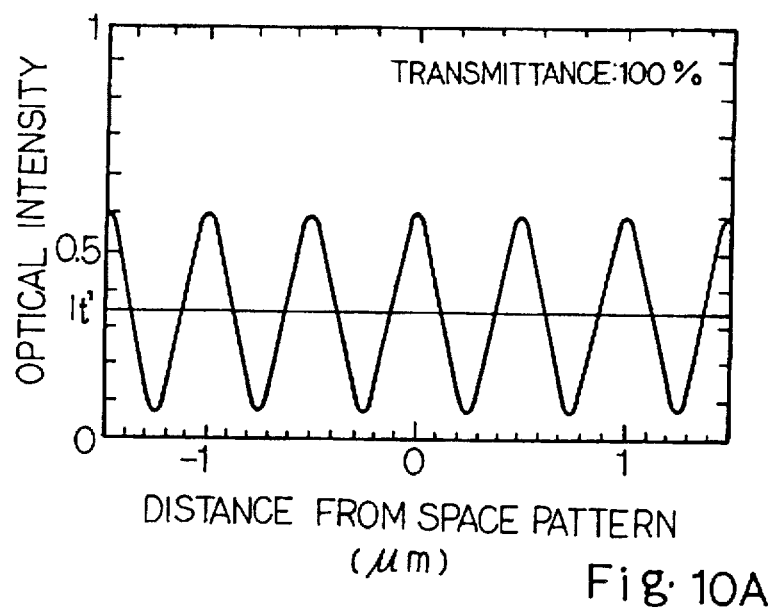
FIG. 10A is a graph showing a distribution of optical intensity under the transmittance of an auxiliary pattern of the photo-mask at 100 percent.
Figure 10B:
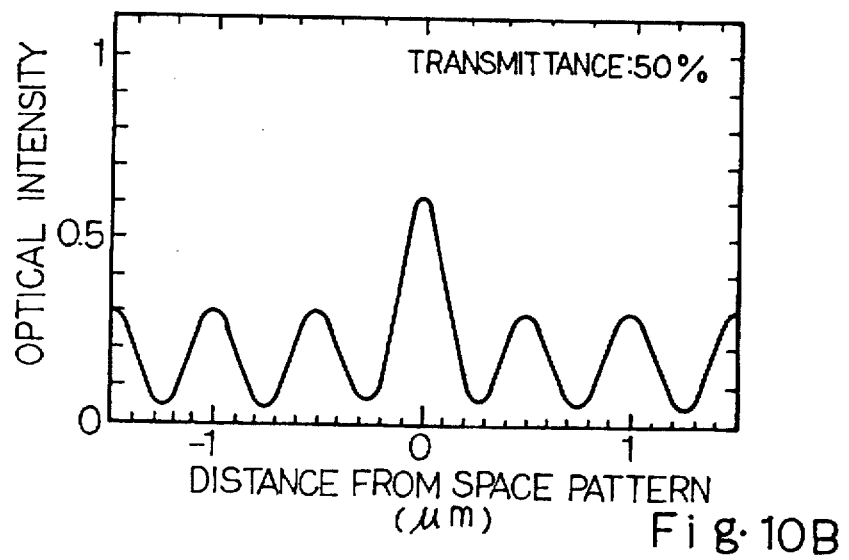
FIG. 10B is a graph showing a distribution of optical intensity under the transmittance of an auxiliary pattern of the photo-mask at 50 percent.
Figure 10C:
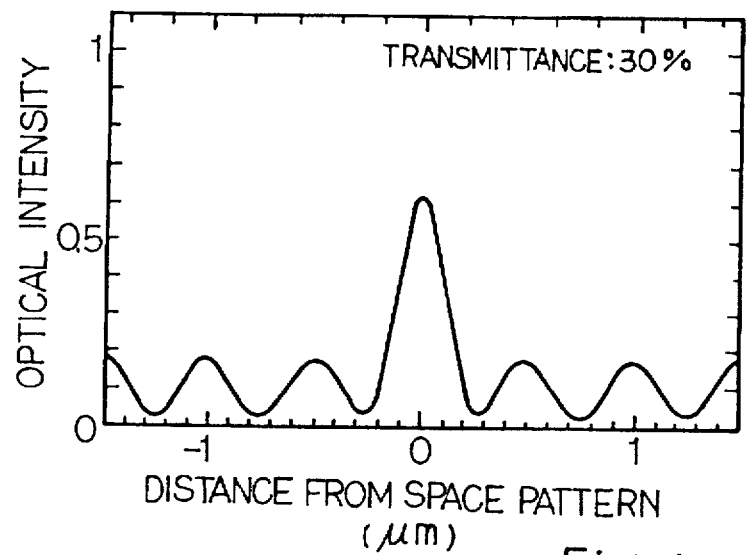
FIG. 10C is a graph showing a distribution of optical intensity under the transmittance of an auxiliary pattern of the photo-mask at 30 percent.
Figure 10D:
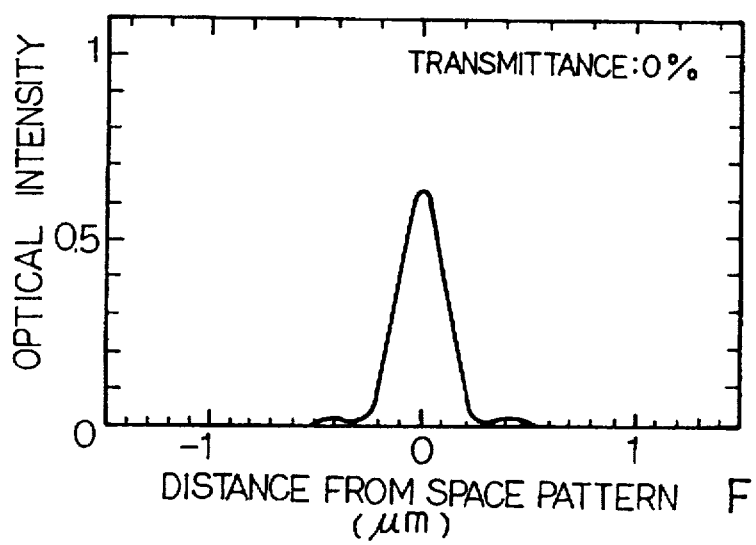
FIG. 10D is a graph showing a distribution of optical intensity under the transmittance of an auxiliary pattern of the photo-mask at zero percent.

FIGS. 8 and 9 illustrate a photo-mask embodying the present invention, and comprises a transparent glass substrate 41, semi-transparent rectangular plate members 42 and 43 formed on the transparent glass substrate 41 and non-transparent rectangular strips 44a, 44b, 44c and 44d of chromium formed on the semi-transparent rectangular plate member 42 at intervals and non-transparent rectangular strips 44e, 44f, 44g and 44h formed on the semi-transparent rectangular plate member 43 at intervals. Although the semi-transparent rectangular plate members 42 and 43 and the non-transparent rectangular strips 44a to 44h are hatched in FIG. 8, the hatching lines do not mean cross sections, but are provided for the sake of clear discrimination from the transparent glass substrate 41.

The semi-transparent rectangular plate member 42 is spaced apart from the other semi-transparent rectangular plate member 43 by 1.25 microns, and a space takes place between the semi-transparent rectangular plate members 42 and 43. The non-transparent rectangular strips 44a–44d and 44e–44h are equal in width and length, and are 1.25 micron in width. Two adjacent non-transparent rectangular strips on the semi-transparent rectangular plate member 42 are spaced from each other by 1.25 microns, and the other non-transparent rectangular strips 44e–44h on the plate member 43 are also arranged at intervals of 1.25 microns.

The non-transparent rectangular strips 44d/44e and the transparent glass substrate 41 define an isolated space pattern 45. The non-transparent rectangular strips 44a to 44h define a photo-shield pattern 46 in the semi-transparent rectangular plate members 42/43. The semi-transparent rectangular plate members 42 and 43 are exposed to the gaps between the non-transparent rectangular strips 44a–44d and 44e–44h, and these exposed rectangular portions of the semi-transparent rectangular plate members 42 and 43 define a semi-transparent auxiliary pattern 47 between the non-transparent rectangular strips 44a–44h.

The present inventors simulated a pattern transfer through the photo-mask shown in FIGS. 8 and 9. The photo-mask was assumed to be installed in a reduction projection aligner, and the optical conditions were identical with the simulation for the photo-mask shown in FIGS. 2 and 3. The present inventors obtained distribution of optical intensity through the simulation, and the distributions of optical intensity were plotted in FIGS. 10A to 10D.

FIGS. 4A to 4D illustrate the distributions under the transmittances of the semi-transparent auxiliary pattern 47 at 100 percent, 50 percent, 30 percent and zero percent, respectively. The distribution of optical intensity shown in FIG. 10A corresponds to a photo-mask where the isolated space patterns 45 and the non-transparent rectangular strips 44a–44h are altered with each other over the transparent glass substrate 41. On the other hand, the distribution of optical intensity shown in FIG. 10D corresponds to a photo-mask where only the isolated space pattern is formed.

When the optical intensity was optimized, the illuminous light passing through the semi-transparent auxiliary pattern 47 did not form an opening in an area of a photo-resist layer. The present inventors determined the optimum optical intensity It' as similar to the photo-mask shown in FIGS. 2 and 3, and the optimum optical intensity It' was less than 0.337. If the transmittance of the semi-transparent auxiliary pattern 47 was not greater than 40 percent, the semi-transparent auxiliary pattern 47 made the optical intensity on the photo-resist layer less than 0.337. In cases where the photo-resist mask had the isolated space pattern 45, if the transmittance of the semi-transparent auxiliary pattern 47 was too large, the optical radiation therethrough decreased the thickness of the area of the photo-resist layer corresponding to the auxiliary pattern 47 below a critical thickness, and an etchant could not exactly pattern a layer under the photo-resist mask. When a manufacturer determines the transmittance of the semi-transparent auxiliary pattern 45, the undesirable decrease of thickness should be taken into account.

The photo-mask implementing the second embodiment achieves the advantages as similar to the first embodiment.

Third Embodiment

Figure 11:
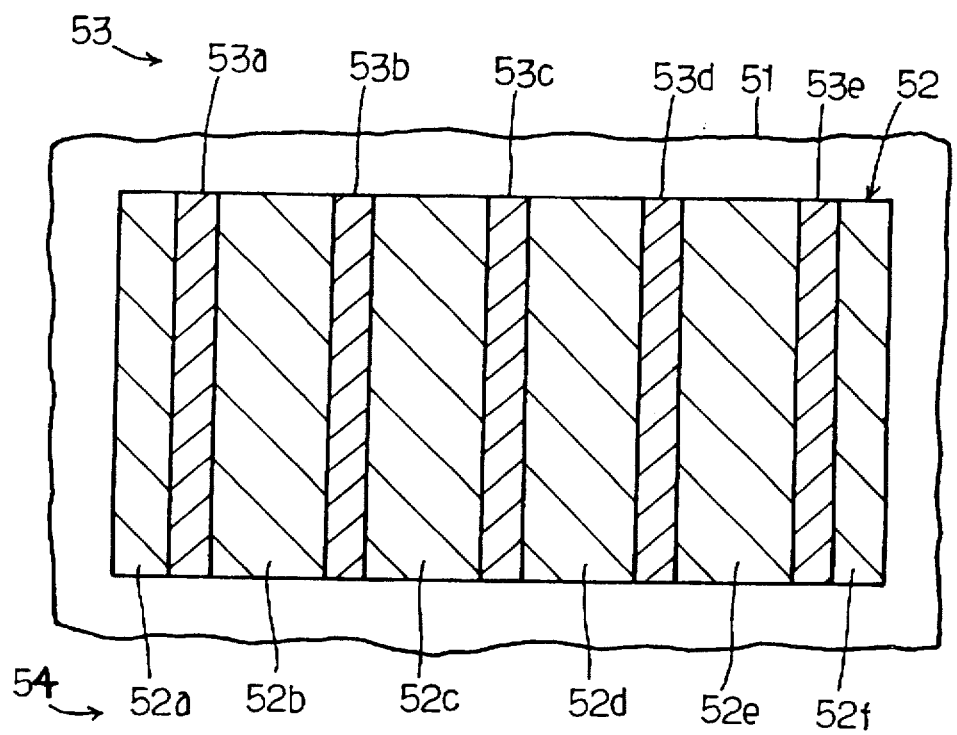
FIG. 11 is a plan view showing another photo-mask according to the present invention.

FIG. 11 illustrates another photo-mask embodying the present invention. The photo-mask comprises a transparent glass substrate 51, a semi-transparent rectangular plate member 52 formed on the transparent glass substrate 51 and photo-shield rectangular strips 53a, 53b, 53c, 53d and 53e formed on the semi-transparent rectangular plate member 52 at intervals. The photo-shield rectangular strips 53a to 53e on the semi-transparent plate member 52 form a non-transparent main pattern 53, and semi-transparent rectangular portions 52a to 52f uncovered with the photo-shield rectangular strips 53a to 53e form a semi-transparent auxiliary pattern 54. The hatching lines do not represent a cross section, but rather the photo-shield rectangular strips 53a to 53e and the semi-transparent rectangular portions 52a to 52f for clear discrimination.

The semi-transparent rectangular portion 52b/52c/52d/52e is three times larger in width than the photo-shield rectangular strip 53a/53b/53c/53d/53e, and the photo-shield rectangular strips 53a–53e are altered with the semi-transparent rectangular portions 52b–52e at a constant pitch.

The non-transparent main pattern 53 is of a line-and-space pattern, and the space is wider than the line. If the spaces are transparent, the optical radiation passing therethrough generates a large amount of hydrogen ion in the chemically amplified photo-resist layer on both sides of the areas corresponding to the photo-shield rectangular strips 53a to 53e, and excess hydrogen ion diffused into the areas damages the resist pattern. However, the semi-transparent auxiliary pattern weakens the optical intensity on the chemically amplified photo-resist layer, and, accordingly, prevents the areas corresponding to the photo-shield rectangular strips 53a to 53e from the excess hydrogen ion.

The photo-mask shown in FIG. 11 further achieves the other advantages of the first embodiment.

Fourth Embodiment

Figure 12:
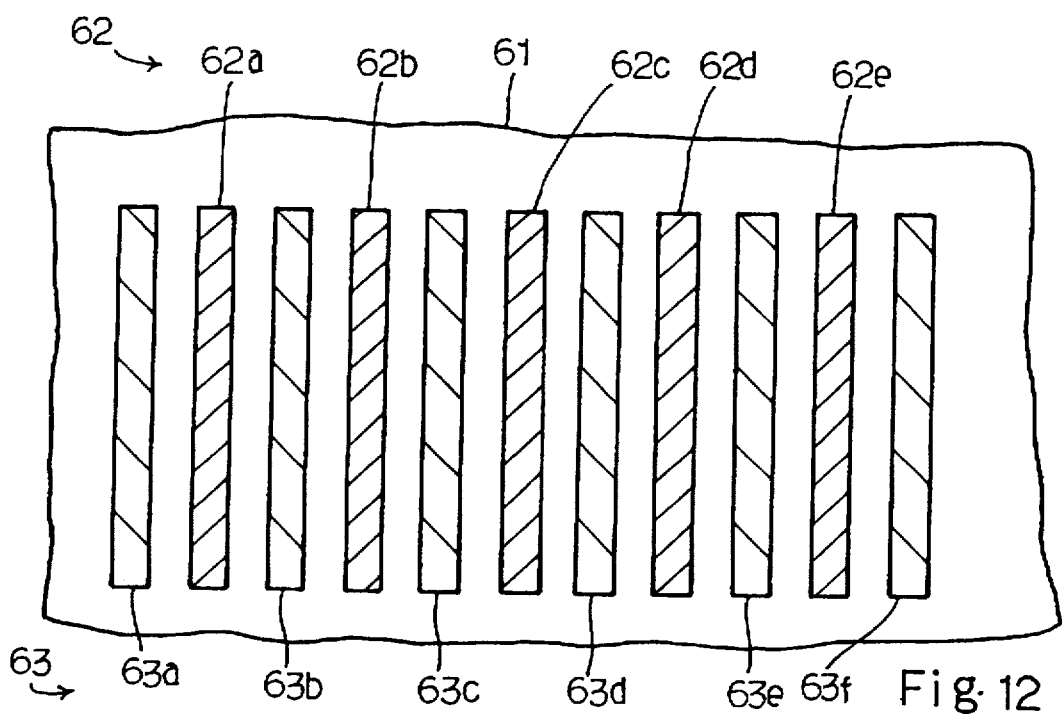
FIG. 12 is a plan view showing yet another photo-mask according to the present invention.

Turning to FIG. 12 of the drawings, a photo-mask embodying the present invention is fabricated on a transparent glass substrate 61. Photo-shield rectangular strips 62a, 62b, 62c, 62d and 62e are formed on the transparent glass substrate 61 at intervals, and the transparent glass substrate 61 is exposed to transparent spaces between the photo-shield rectangular strips 62a to 62e, and the transparent space is three times wider than the photo-shield rectangular strip 62a to 62e. Semi-transparent rectangular strips 63a to 63f are formed on both sides of the photo-shield rectangular strips 62a and 62e and between the photo-shield rectangular strips 62a to 62e, and are equal in length and width to the photo-shield rectangular strips 63a to 63f. Each of the semi-transparent rectangular strips 63b to 63e and adjacent photo-shield rectangular strips 62a/62b, 62b/62c, 62c/62d and 62d/62e define transparent area as wide as the photo-shield rectangular strip 62a–62e and the semi-transparent rectangular strip 63a–63f.

The hatching lines on the photo-shield rectangular strips 62a to 62e and the semi-transparent rectangular strips 63a to 63f do not represent a cross section as similar to those of the embodiments described hereinbefore.

The photo-shield rectangular strips 62a to 62e define a non-transparent main pattern 62 in the transparent glass substrate 61, and the semi-transparent rectangular strips 63a to 63f defines a semi-transparent auxiliary pattern 63 in the transparent glass substrate 61.

The transmittance and the number of the semi-transparent rectangular strips 63a to 63f are determined through a simulation similar to the simulation described in conjunction with the first embodiment. Although the fourth embodiment has the line to space ratio of 1:3, it is possible to apply the present invention to any photo-mask with the line to space ration different from 1:3.

The photo-mask shown in FIG. 12 achieves all the advantages of the first embodiment.

Process Sequence

A process sequence according to the present invention starts with preparation of a transparent glass substrate 71. First, molybdenum silicide (MoSi) is deposited to 45 nanometers thick on the transparent glass substrate 71 by using a sputtering, and the transparent glass substrate 71 is overlain by a molybdenum silicide layer 72. The i-ray passes through the molybdenum silicide layer 72 of 45 nanometers thick at the transmittance of 40 percent. In this instance, the transmittance of the semi-transparent layer 72 is regulated by changing the substance such as molybdenum silicide and the thickness of the semi-transparent layer 72.

Figure 13A:
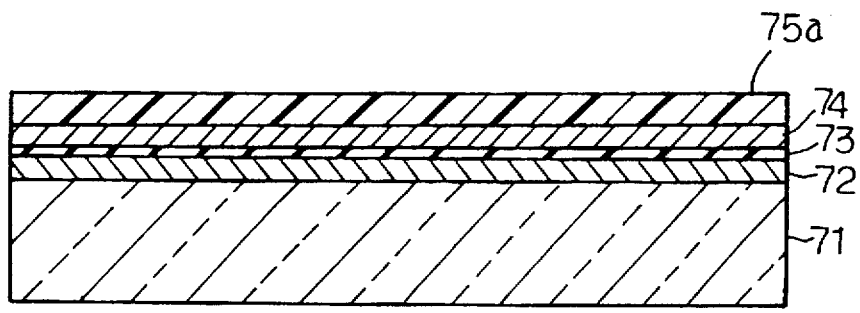
FIGS. 13A to 13F are cross sectional views showing a process sequence for fabricating a photo-mask according to the present invention.
Figure 13B:
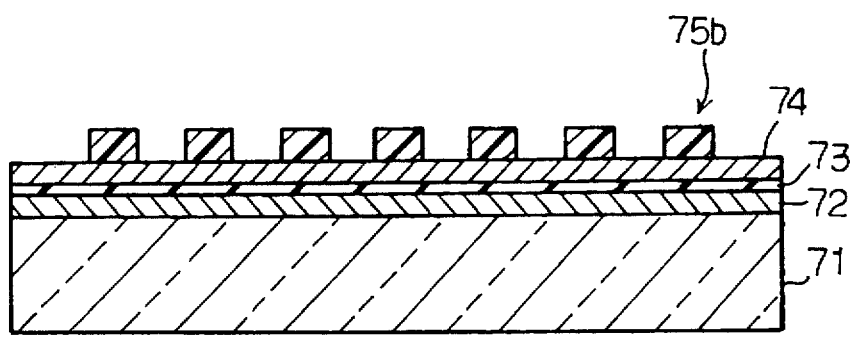

Subsequently, silicon oxide is deposited to 40 nanometers thick over the molybdenum silicide layer 71 by using a plasma-assisted chemical vapor deposition, and the molybdenum silicide layer 72 is overlain by a silicon oxide layer 73. A chromium target is sputtered, and a chromium layer is formed on the silicon oxide layer 73. Photoresist solution is spread over the entire surface of the chromium layer 74, and the photo-resist film is baked for forming a photo-resist layer 75a as shown in FIG. 13A.

A pattern image is transferred to the photo-resist layer 75a, and the pattern image is developed so as to form a photo-resist etching mask 75b on the chromium layer 74. Using the photo-resist etching mask 75b, the chromium layer 74, the silicon oxide layer 73 and the molybdenum silicide layer 72 are successively patterned by using a dry etching technique, and laminated blocks 76a to 76g are left on the transparent glass substrate 71. A molybdenum silicide strip 72a, a silicon oxide strip 73a and a chromium strip 74a form each of the laminated blocks 76a to 76g. The silicon oxide layer 73 prevents the molybdenum silicon layer 72 from etchant against the chromium layer 74 in a later stage. The photo-resist etching mask 75b is stripped off, and the resultant structure is illustrated in FIG. 13C.

Figure 13C:
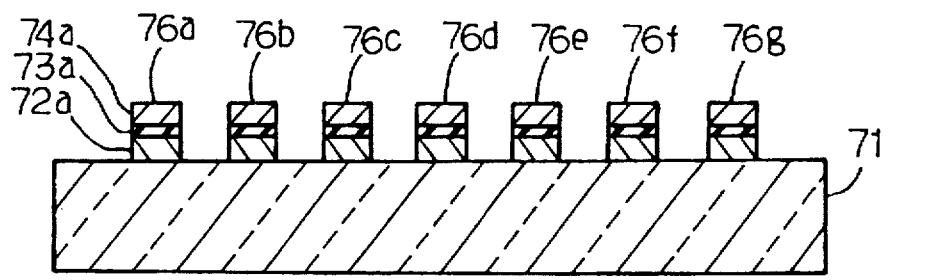
Figure 13D:
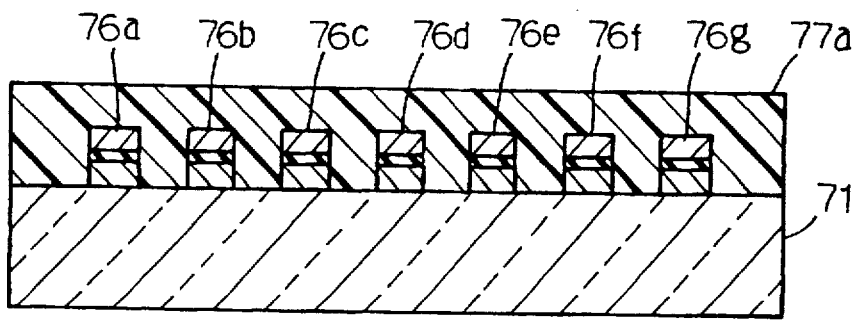

Photo-resist solution is spread over the entire surface of the resultant structure shown in FIG. 13C, and the photo-resist film is baked for forming a photo-resist layer 77a. The laminated blocks 76a to 76g are covered with the photo-resist layer 77a as shown in FIG. 13D.

Figure 13E:
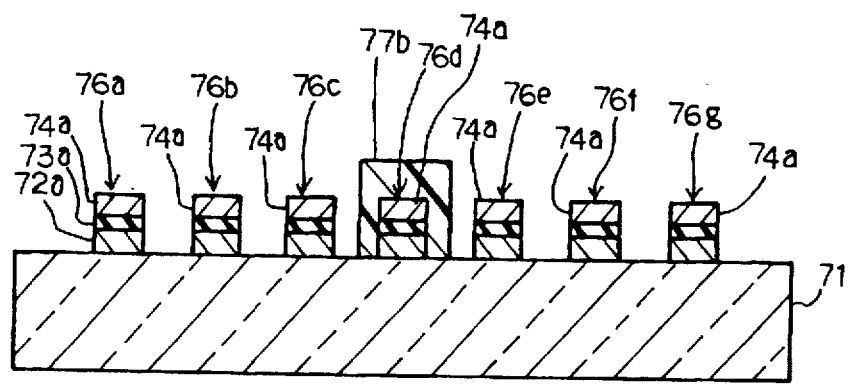

A pattern image is transferred to the photo-resist layer 77a, and is developed for forming a photo-resist etching mask 77b. The photo-resist mask 77b covers the laminated block 76d only, and the photo-resist layer 77a over the other laminated blocks 76a to 76c and 76e to 76g is removed. The resultant structure is illustrated in FIG. 13E.

Figure 13F:
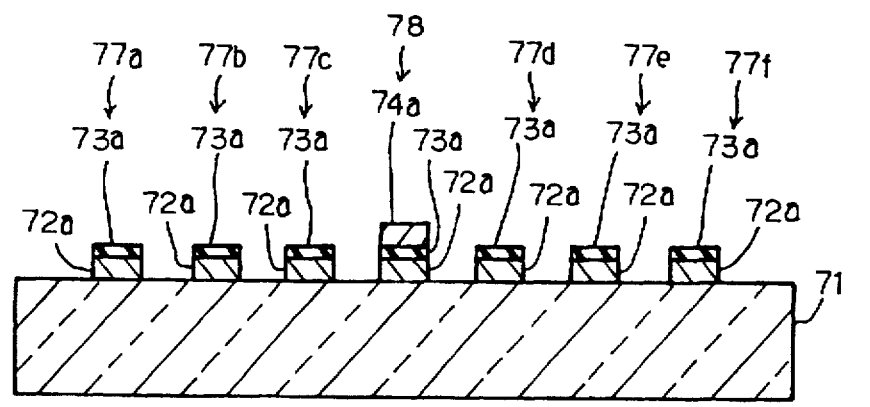

The photo-resist etching mask 77b allows a dry etchant to remove the chromium strips 74a from the laminated blocks 76a to 76c and 76e to 76g, and does not expose the chromium strip 74a of the laminated block 76d to the dry etchant. The dry etchant removes the chromium strips 74a from the laminated blocks 76a to 76c and 76e to 76g, and the dry etching is terminated at the silicon oxide strips 73a. Thus, the silicon oxide strips 73a prevent the molybdenum silicide strips 72a from the etchant against the chromium. As a result, a non-transparent isolated line 76 and semi-transparent lines 77a to 77f are left on the transparent glass substrate 71 as shown in FIG. 13F. The photo-mask shown in FIG. 13F is similar in pattern to the photo-mask shown in FIGS. 2 and 3. The other photo-masks already described are similarly fabricated through the process sequence described hereinbefore.

Subsequently, description is made on a controlling method of phase difference. When a phase difference takes place between an optical radiation through a semi-transparent auxiliary pattern and an optical radiation through a transparent substrate, the phase difference tends to affect a resist pattern transferred from a main pattern. This means that the phase difference should be restricted, and the phase difference less affective ranges from ±10 degrees or, more exactly, 360×n±10 degrees on a photo-resist layer where n is a natural number. The semi-transparent layer is causative of the phase difference, and the phase difference is regulable by selecting the thickness of the semi-transparent layer.

As will be appreciated from the foregoing description, the semi-transparent strips give a periodicity to a non-transparent strip or a space at an end position of a main pattern, and is effective against an uneven proximity effect. When the photo-mask according to the present invention is illuminated by using a modified illumination, the depth of focus of an isolated pattern is improved. The semi-transparent auxiliary pattern restricts hydrogen ion around an area or areas adjacent to an area to which the main pattern is transferred, and the main pattern is exactly transferred to the area. Finally, it is not necessary to form the semi-transparent strip smaller in dimensions than the non-transparent strip, and the non-transparent strip is allowed to be close to the resolution limit.

Although particular embodiments of the present invention have been shown and described, it will be obvious to those skilled in the art that various changes and modifications may be made without departing from the spirit and scope of the present invention.

For example, semi-transparent layers and photo-shield or non-transparent layers may be formed from various combination of semi-transparent substance and non-transparent substance. The combination of molybdenum silicide and the chromium is one example of the available combinations.

The present invention is applicable to a photo-mask for any wave-length. In the above embodiments, the main pattern is an isolated line pattern, an isolated space pattern and a line-and-space pattern, and the line width and the space width are 0.25 micron. However, the main pattern is not limited to the above patterns, and the line width and the space width are changeable. When the pattern and/or the dimensions are changed, the transmittance of the semi-transparent layers should be regulated to an appropriate value through the simulation described in connection with the first embodiment or an appropriate experiment.

If an isolated line pattern, an isolated space pattern, a periodic pattern and a periodic line-and-space pattern are selectively formed on a substrate, the transmittance of each semi-transparent auxiliary pattern should be regulated to an individually appropriate value. Nevertheless, it is not easy to individually regulate semi-transparent auxiliary patterns to appropriate transmittances. In this case, it is recommendable to regulate the width of semi-transparent strips in such a manner as to optimize the total amount of light passing through each auxiliary pattern. For example, the line width of semi-transparent strips for an isolated space pattern is regulated to a smaller value than the line width of semi-transparent strips for an isolated line pattern.

Figure 14:
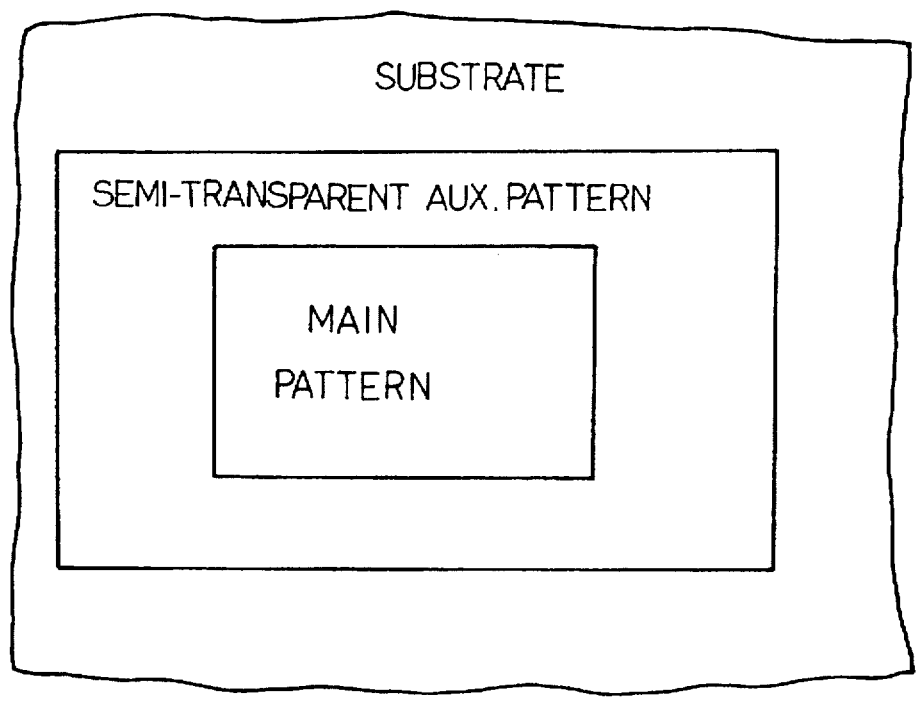
FIG. 14 is a plan view showing a layout of a main pattern and an auxiliary pattern.

A semi-transparent auxiliary pattern may encircle a main pattern as shown in FIG. 14.

What is claimed is:

1. A photo-mask used in a pattern transfer to a photo-sensitive layer, comprising:

a substrate having a first transmittance;

a photo-shield pattern having a second transmittance, and assigned a first area of said substrate; and a semi-transparent pattern having a third transmittance greater than said second transmittance and less than said first transmittance, and assigned a second area of said substrate in the vicinity of said first area, said photo-shield pattern and one of said substrate and said semi-transparent pattern defining a main pattern to be transferred to said photo-sensitive layer through a first light, said semi-transparent pattern and one of said substrate and said photo-shield pattern defining an auxiliary pattern to be carried by a second light so as to cause said first light to exactly transfer said main pattern to said photo-sensitive layer, wherein said first light and said second light are substantially in-phase.

2. The photo-mask as set forth in claim 1, in which said semi-transparent pattern and said photo-shield pattern are respectively include a plurality of semi-transparent strips formed on said substrate and at least one non-transparent strip formed on said substrate, and each of said plurality of semi-transparent strips is equal in dimensions to said at least one non-transparent strip.

3. The photo-mask as set forth in claim 2, in which said plurality of semi-transparent strips are provided partially on one side of said at least one non-transparent strip and partially on the other side of said at least one non-transparent strip, and said plurality of semi-transparent strips and said at least one non-transparent strip are arranged at a constant pitch.

4. The photo-mask as set forth in claim 3, in which a gap between adjacent two of said plurality of semi-transparent strips and said non-transparent strip is equal in width to each of said plurality of semi-transparent strips and said non-transparent strip.

5. The photo-mask as set forth in claim 2, in which said photo-shield pattern further includes a non-transparent strip equal in dimensions to said at least one no-transparent strip.

6. The photo-mask as set forth in claim 5, in which said at least one non-transparent strip and said non-transparent strip are located between selected ones of said plurality of semi-transparent strips and remaining ones of said plurality of semi-transparent strips.

7. The photo-mask as set forth in claim 5, in which said plurality of semi-transparent strips are altered with said at least one non-transparent strip and said non-transparent strip.

8. The photo-mask as set forth in claim 1, in which said semi-transparent pattern includes a plurality of semi-transparent plates formed on said substrate and spaced from one another, and said photo-shield pattern includes a plurality of non-transparent strips formed on said plurality of semi-transparent plates at intervals.

9. The photo-mask as set forth in claim 8, in which each of said plurality of non-transparent strips is equal in width to each of semi-transparent portions of said semi-transparent plates exposed to gaps between said plurality of non-transparent strips.

10. The photo-mask as set forth in claim 1, in which said semi-transparent pattern includes a semi-transparent plate, and said photo-shield pattern includes a plurality of non-transparent strips formed on said semi-transparent plate at intervals.

11. The photo-mask as set forth in claim 10, in which each of said plurality of non-transparent strips is narrower than each of semi-transparent portions exposed to gaps between said plurality of non-transparent strips.

12. The photo-mask as set forth in claim 1, in which said semi-transparent pattern and said photo-shield pattern are formed of molybdenum silicide and chromium, respectively.

13. The photo-mask as set forth in claim 1, in which a thickness of said semi-transparent pattern is regulated in such a manner that a phase difference between said first light passing through said substrate and said second light passing through said semi-transparent pattern ranges between (360×n+10) degrees on a photo-resist layer where n is a natural number.

14. A photo-mask used in pattern transfer to a photosensitive layer, comprising:

a substrate having a first transmittance;

a photo-shield pattern having a second transmittance, and assigned a first area of said substrate;

a semi-transparent pattern having a third transmittance greater than said second transmittance and less than said first transmittance, and assigned a second area of said substrate in the vicinity of said first area;

said photo-shield pattern and one of said substrate and said semi-transparent pattern defining a main pattern for transfer to said photo-sensitive layer through a first light;

said semi-transparent pattern and one of said substrate and said photo-shield pattern defining an auxiliary pattern to be carried by a second light so as to cause said first light to exactly transfer said main pattern to said photosensitive layer;

characterized in that a phase difference is present at the photosensitive layer between said first light and said second light and said phase difference ranges between (360×n+10) degrees wherein n is a natural number.

15. A process of fabricating a photo-mask comprising the steps of:

a) preparing a substrate having a first transmittance;

b) laminating a semi-transparent layer having a second transmittance less than said first transmittance, an etching stopper layer and a photo-shield layer having a third transmittance less than second transmittance on said substrate for forming a primary multiple-level structure on said substrate, said etching stopper layer being effective against an etchant for said photo-shield layer;

c) providing a first etching mask on said primary multiple-level structure;

d) selectively etching said primary multiple-level structure so as to form a secondary multiple-level structure from said primary multiple-level structure, a part of said substrate being exposed to a hollow space formed in said secondary multiple-level structure;

e) removing said first etching mask from said secondary multiple-level structure;

f) providing a second etching mask on said secondary multiple-level structure;

g) selectively etching said photo-shield layer of said secondary multiple-level structure so as to form at least one recess in said secondary multiple-level structure, a part of said etching stopper layer being exposed to said at least one recess; and h) removing said second etching mask.

* * * * *